(12) United States Patent
Kong et al.

(10) Patent No.: US 11,942,931 B2
(45) Date of Patent: Mar. 26, 2024

(54) RADIO FREQUENCY SWITCHING TIME REDUCING CIRCUIT

(71) Applicant: SKYWORKS SOLUTIONS, INC., Irvine, CA (US)

(72) Inventors: Lynn Yun Kong, Lexington, MA (US); Yi Yang, Malden, MA (US); Bo Zhou, Acton, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/955,971

(22) Filed: Sep. 29, 2022

(65) Prior Publication Data

US 2023/0104495 A1     Apr. 6, 2023

Related U.S. Application Data

(60) Provisional application No. 63/250,063, filed on Sep. 29, 2021.

(51) Int. Cl.
*H03K 17/0412*     (2006.01)
*H03K 17/16*     (2006.01)
*H03K 17/693*     (2006.01)

(52) U.S. Cl.
CPC ..... *H03K 17/693* (2013.01); *H03K 17/04123* (2013.01); *H03K 17/162* (2013.01); *H03K 2217/0081* (2013.01)

(58) Field of Classification Search
CPC .......... H03K 17/693; H03K 17/04123; H03K 17/162; H03K 17/6872; H03K 2217/0081
See application file for complete search history.

(56) References Cited

U.S. PATENT DOCUMENTS

| | | | |
|---|---|---|---|
| 5,919,253 A * | 7/1999 | Schneider | G06F 13/4081 |
| | | | 719/326 |
| 6,559,676 B1 * | 5/2003 | Tomita | H03K 17/166 |
| | | | 327/170 |
| 11,290,105 B1 * | 3/2022 | Kovac | H03K 17/693 |
| 2017/0272066 A1 * | 9/2017 | Scott | H03K 17/161 |
| 2022/0006427 A1 * | 1/2022 | Sugimoto | H03F 3/245 |

* cited by examiner

*Primary Examiner* — Sibin Chen
(74) *Attorney, Agent, or Firm* — Chang & Hale LLP

(57) ABSTRACT

A switching circuit comprises a radio frequency (RF) switch, a gate resistor, a voltage source, a transmission gate, and coupling circuitry configured to couple a gate of the RF switch, a first side of the gate resistor, and the transmission gate at a first node and the voltage source, a second side of the gate resistor, and the transmission gate at a second node.

16 Claims, 4 Drawing Sheets

US 11,942,931 B2

RADIO FREQUENCY SWITCHING TIME REDUCING CIRCUIT

CROSS-REFERENCE TO RELATED APPLICATION

This application claims priority to U.S. Provisional Application No. 63/250,063 filed Sep. 29, 2021, entitled RADIO FREQUENCY SWITCHING TIME REDUCING CIRCUIT, the disclosure of which is hereby expressly incorporated by reference herein in its respective entirety.

BACKGROUND

Some embodiments of the present disclosure relate to Radio Frequency (RF) switches and/or circuits comprising RF switches.

RF switch applications can benefit from and/or require fast switching time. A gate capacitance and/or resistance of an RF Switch can create large resistor-capacitor (RC) time constant delays and/or can result in a relatively long switching time.

Some switches (e.g., double pole double throw (DPDT) switches) can utilize relatively large RF switches (e.g., W=34×16 mm). However, the gate capacitance and/or gate resistance for such designs can be relatively high and/or can cause high delays. For example, a time constant associated with an RF switch may be proportional to the gate resistance multiplied by the gate capacitance of the RF switch.

SUMMARY

Some implementations of the present disclosure relate to a switching circuit including: a radio frequency (RF) switch; a gate resistor; a voltage source; a transmission gate; and coupling circuitry configured to couple a gate of the RF switch, a first side of the gate resistor, and the transmission gate at a first node and the voltage source, a second side of the gate resistor, and the transmission gate at a second node.

In some aspects, the techniques described herein relate to a switching circuit wherein the transmission gate includes a p-channel metal-oxide-semiconductor (PMOS).

In some aspects, the techniques described herein relate to a switching circuit wherein the transmission gate includes an n-channel metal-oxide-semiconductor (NMOS).

In some aspects, the techniques described herein relate to a switching circuit wherein the coupling circuitry is further configured to couple a source of the PMOS to a drain of the NMOS.

In some aspects, the techniques described herein relate to a switching circuit wherein the coupling circuitry is further configured to couple a drain of the PMOS to a source of the NMOS.

In some aspects, the techniques described herein relate to a switching circuit wherein the coupling circuitry is further configured to couple the gate of the RF switch, the first side of the gate resistor, a drain of the PMOS, and a source of the NMOS at the first node.

In some aspects, the techniques described herein relate to a switching circuit wherein the coupling circuitry is further configured to couple the voltage source, the second side of the gate resistor, a source of the PMOS, and a drain of the NMOS at the second node.

In some aspects, the techniques described herein relate to a switching circuit further including a first level shifter configured to supply voltage pulses to the PMOS.

In some aspects, the techniques described herein relate to a switching circuit further including a second level shifter configured to supply voltage pulses to the NMOS.

In some aspects, the techniques described herein relate to a switching circuit wherein the first level shifter and the second level shifter are configured to apply complementary dynamic pulses to the PMOS and NMOS.

In some aspects, the techniques described herein relate to a switching circuit wherein the first level shifter and the second level shifter are configured to turn on when the RF switch is turned on.

In some aspects, the techniques described herein relate to a switching circuit further including a first voltage pulse source coupled to the first level shifter.

In some aspects, the techniques described herein relate to a switching circuit further including a second voltage pulse source coupled to the second level shifter.

In some aspects, the techniques described herein relate to a switching circuit wherein the coupling circuitry is further configured to couple the gate resistor in parallel with the transmission gate.

In some aspects, the techniques described herein relate to a switching circuit wherein the transmission gate is configured to short out the gate resistor.

In some aspects, the techniques described herein relate to a circuit including: a radio frequency (RF) switch; a transmission gate including p-channel metal-oxide-semiconductor (PMOS) and an n-channel metal-oxide-semiconductor (NMOS), wherein the transmission gate is configured to provide dynamic complementary pulsing voltages to the RF switch; and coupling circuitry configured to couple a gate of the RF switch to the transmission gate.

In some aspects, the techniques described herein relate to a circuit further including a gate resistor, wherein the coupling circuitry is further configured to couple the gate of the RF switch, the gate resistor, and the transmission gate at a first node.

In some aspects, the techniques described herein relate to a circuit wherein the transmission gate is configured to short out the gate resistor in response to the RF switch turning on.

In some aspects, the techniques described herein relate to a circuit further including a first level shifter coupled to a gate of the PMOS.

In some aspects, the techniques described herein relate to a circuit further including a second level shifter coupled to a gate of the NMOS.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

The headings provided herein, if any, are for convenience only and do not necessarily affect the scope or meaning of the claimed invention.

Radio frequency (RF) switch applications can benefit from and/or require fast switching time. A gate capacitance and/or resistance of an RF Switch can create large resistor-capacitor (RC) time constant delays and/or can result in a relatively long switching time.

Some switches (e.g., double pole double throw (DPDT) switches) can utilize relatively large RF switches (e.g., W=34×16 mm). However, the gate capacitance and/or gate resistance for such designs can be relatively high and/or can cause high delays. For example, a time constant associated with an RF switch may be proportional to the gate resistance multiplied by the gate capacitance of the RF switch.

Some methods of reducing switching time can involve using transmission gate switches to short out the gate resistance of the RF switch application during switching. However, voltage swings can cause breakdown of the transmission gate switches in such cases. For example, a breakdown voltage for a transmission gate switch may be in the range of 4.5V. Generally, RF switch gate voltage swings from a range of a negative first voltage (e.g., −V1) to a positive second voltage (e.g., V2). In some switch applications, the negative first voltage can be approximately −2.5V and/or the positive second voltage may be approximately 3.5V, resulting in a voltage swing of 6 volts, which can exceed the breakdown voltage (e.g., 3.5V) of the transmission gate switch. Thus, use of a simple switch to short out the gate resistance may not be effective in cases in which voltage swing exceeds the breakdown voltage of the transmission gate switch.

Figure 1:
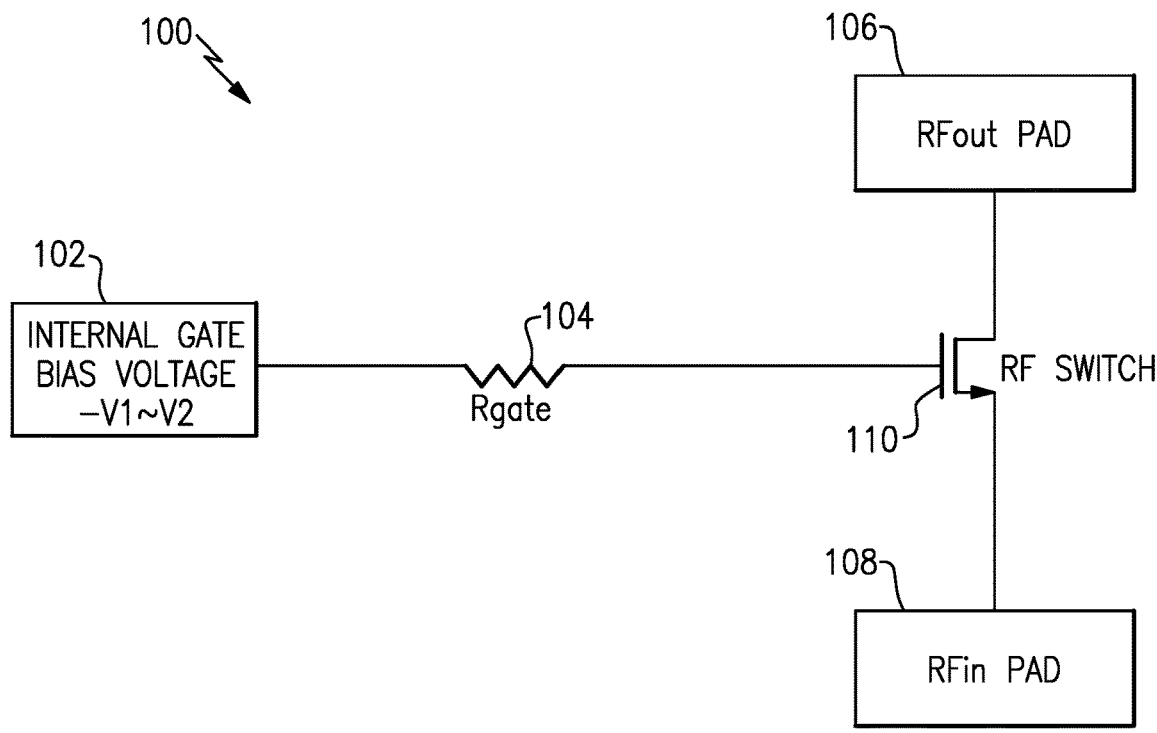
FIG. 1 illustrates an example switching circuit in accordance with one or more embodiments.

FIG. 1 illustrates an example switching circuit 100 in accordance with one or more embodiments. The circuit 100 can comprise an RF switch 110 (e.g., a transistor and/or field-effect transistor) including a gate, a source, and a drain. The gate of the RF switch 110 may be coupled (e.g., via coupling circuitry) to a gate resistor 104. The drain of the RF switch 110 may be coupled to an RF output pad 106 and/or the source of the RF switch 110 may be coupled to an RF input pad 108. The gate resistor 104 may be coupled in series with and/or may experience a voltage drop from a voltage source 102, which may be configured to deliver a variable internal gate bias voltage from a range of −V1 to V2. The gate resistor 104 may be shorted by a transmission gate switch to speed up RF switching time.

Figure 2:
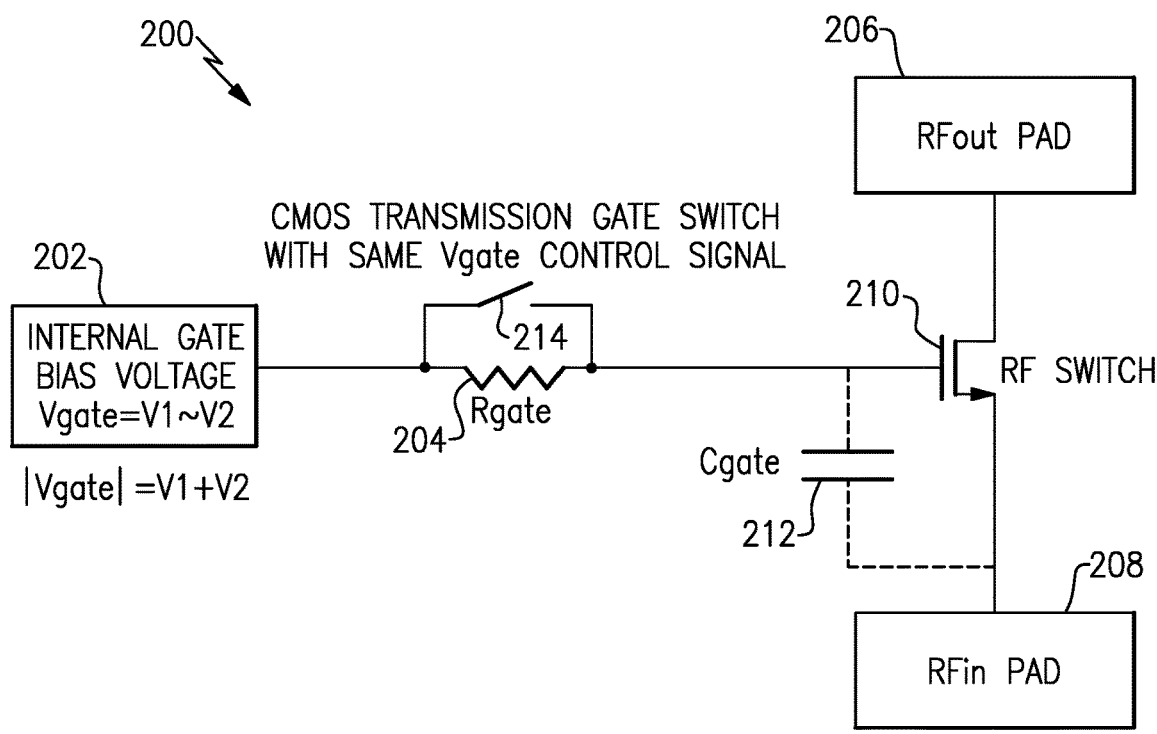
FIG. 2 illustrates gate capacitance for an example switching circuit in accordance with one or more embodiments.

FIG. 2 illustrates gate capacitance for an example switching circuit (e.g., the circuit 100 of FIG. 1) in accordance with one or more embodiments. The circuit 200 can comprise an RF switch 210 (e.g., a transistor and/or field-effect transistor) including a gate, a source, and a drain. The gate of the RF switch 210 may be coupled (e.g., via coupling circuitry) to a gate resistor 204. The drain of the RF switch 210 may be coupled to an RF output pad 206 and/or the source of the RF switch 210 may be coupled to an RF input pad 208. The gate resistor 204 may be coupled in series with and/or may experience a voltage drop from a voltage source 202, which may be configured to deliver a variable internal gate bias voltage from a range of −V1 to V2.

The RF switch 210 may experience an internal gate capacitance, as illustrated by a gate capacitor 212 coupled between the gate of the RF switch 210 and the source of the RF switch 210. The gate capacitance of the RF switch 210 may increase proportionately with the size of the RF switch 210. A product of the gate capacitance and the gate resistance of the RF switch 210 may be indicative of a switching time of the RF switch 210.

In some embodiments, the circuit 200 may comprise a transmission gate switch 214 (e.g., a CMOS gate switch) coupled in parallel with the gate resistor 204. The transmission gate switch 214 may be configured to experience the same gate voltage control circuit as the RF switch 210.

Figure 3:
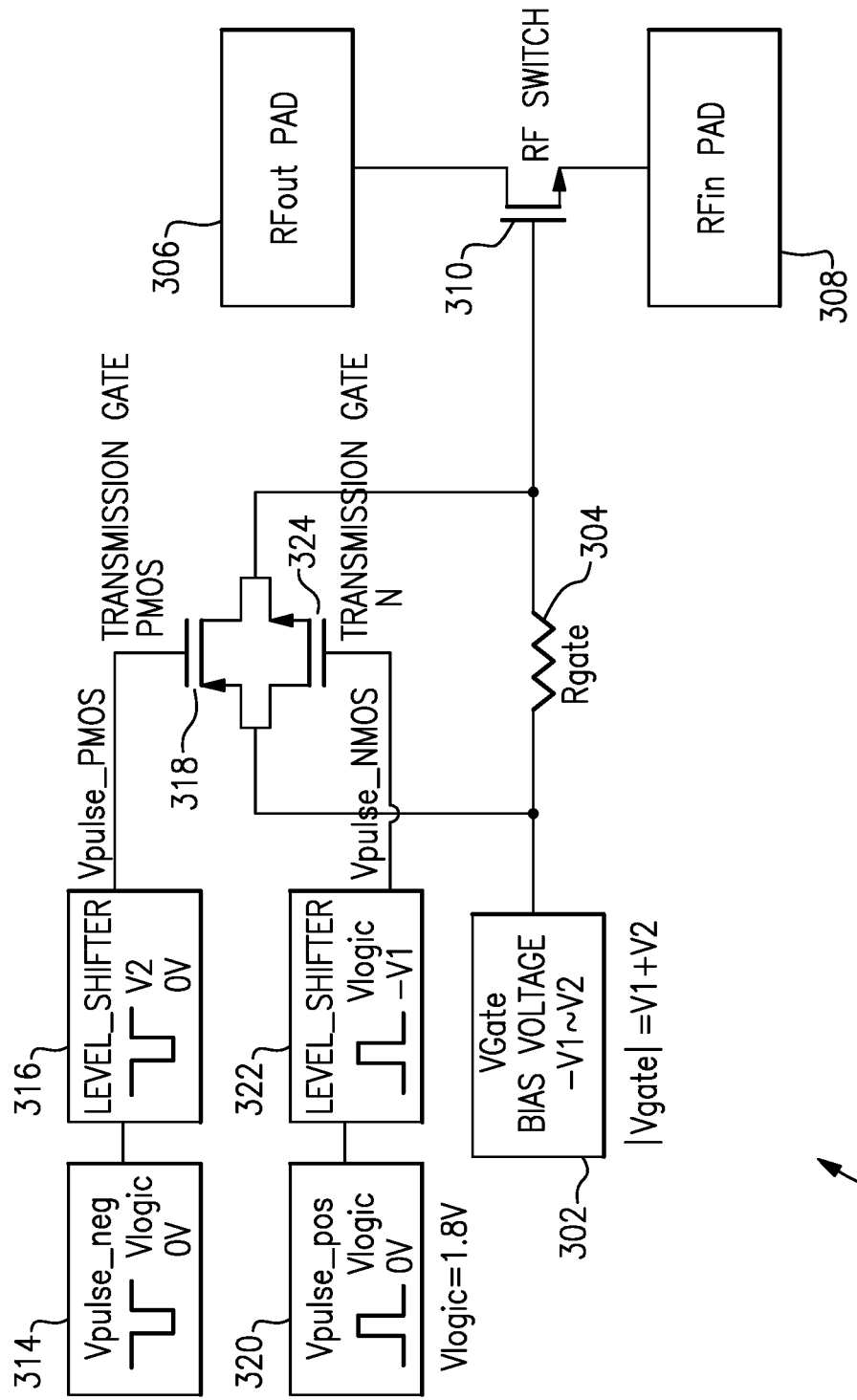
FIG. 3 illustrates another example switching circuit configured to provide dynamic complementary pulsing to reduce switching time and/or startup time (e.g., turn-on time) of an RF switch.

FIG. 3 illustrates another example switching circuit 300 configured to provide dynamic complementary pulsing to reduce switching time and/or startup time (e.g., turn-on time) of an RF switch 310. The circuit comprises a first level shifter 316 associated with and/or coupled to a first voltage pulse source 314 receiving a supply voltage (Vlogic). The circuit 300 further comprises a second level shifter 322 associated with and/or coupled to a second voltage pulse source 320 receiving Vlogic. The first level shifter 316 may be directly coupled to a gate of a p-channel metal-oxide-semiconductor (PMOS) 318 and/or the second level shifter 322 may be directly coupled to a gate of an n-channel metal-oxide-semiconductor (NMOS) 324. The first level shifter 316 and/or second level shifter 322 may be configured to shift a voltage range of a supply voltage. The NMOS 324 and/or PMOS 318 may form a transmission gate configured to short out the gate resistor 304.

The first level shifter 316 and the second level shifter 322 may be configured to apply complementary dynamic pulses to the PMOS 318 and/or NMOS 324 to short the gate resistor 304 when the RF switch 310 is switching or first turned on. Shorting the gate resistor 304 may be configured to cause a reduction in RC time constant of the circuit 300 and/or a reduction in switching time and/or turn-on time of the RF switch 310. Pulses from the first level shifter 316 and the second level shifter 322 may last for a few (e.g., six or seven) microseconds each and/or may depend on the size of the RF switch 310. A drain of the RF switch 310 may be coupled to an output pad 306 and/or a source of the RF switch 310 may be coupled to an input pad 308.

The first level shifter 316 and/or second level shifter 322 may be configured to be turned on when the RF switch is switching and/or turned on. Pulse widths of the first level shifter 316 and/or second level shifter 322 may be set according to the size of the RF switch 310 and/or based on a product of the gate resistance and gate capacitance (e.g., Rgate*Cgate) of the RF switch 310.

The first level shifter 316 and/or second level shifter 322 may be configured to dynamically follow voltage levels of a first voltage source 302 (e.g., a bias voltage) configured to supply a gate voltage to the RF switch 310. By dynamically following the voltage levels of the first voltage source 302, the first level shifter 316 and/or second level shifter 322 may be configured to ensure that the PMOS 318 and/or NMOS 324 do not break down.

A supply voltage (Vlogic) may be supplied by control circuits and/or provide voltage inputs to the first pulse module 314 and/or the second pulse module 320. When the RF switch gate voltage (Vgate) is between a negative voltage value (e.g., −V1) and 0V, the NMOS 324 may be in an on-state and/or the PMOS 318 may be in an off-state. A gate-to-source voltage (e.g., Vgs) of the NMOS 324 may be approximately equivalent to a sum of V1 and Vlogic when the RF switch gate voltage (Vgate) is −V1. The gate-tosource voltage of the NMOS 324 may then be gradually reduced to 0V when the gate voltage rises towards Vlogic.

When the voltage experienced at the RF Switch (Vgate) is between 0V and V2=3.5V, the PMOS 318 may be in an on-state and/or the NMOS 324 may move gradually to an off-state when the gate voltage (e.g., Vgate) approaches Vlogic and then may move completely to the off-state when Vgate reaches V2. A gate-to-source voltage (e.g., Vgs) of the PMOS 318 may be approximately equal to (−V2) when Vgate is at 0V. The gate-to source voltage of the PMOS 318 may then gradually approach 0V and/or PMOS 318 may be turned off when Vgate rises toward V2.

The PMOS 318 and/or NMOS 324, together with the level shifters and/or pulse sources, may be configured to speed up switching time of the RF switch 310, particularly in cases where the RF switch 310 is relatively large and/or where the bias voltage range is from −V1 to V2 and/or V1+V2>4.5V. In some embodiments, degradation of performance of the RF switch 310 may be greatly reduced as a result of the components of the circuit 300.

When the RF switch gate voltage is at a minimum value (e.g., −V1), the NMOS 324 and/or the PMOS 318 may be turned off so that the gate resistor 304 may not be shorted out. When the gate voltage is at a maximum value (e.g., V2), the NMOS 324 and/or the PMOS 318 may be turned off so that the gate resistor 304 may not be shorted out. The gate resistor 304 may only be shorted out when Vgate of the RF switch 310 is in a transition between −V1 to V2 and/or V2 to −V1. During this transition period, either NMOS 324 may be on or PMOS 318 may be on so that the gate resistor 304 may be shorted. The gate resistor 304 may not be shorted out when Vgate of the RF switch 310 is out of the transition period and/or is constant at V2 or −V1. In such cases, both PMOS 318 and NMOS 324 may be turned off.

The PMOS 318 and/or NMOS 324 may advantageously be configured to short out the gate resistor 304 only when the RF switch 310 is turned on. After a turn-on period and/or when the RF switch 310 is operating normally, the PMOS 318 and/or NMOS 324 may not short out the gate resistor 304 such that the gate resistor 304 advantageously supplies resistance to the RF switch during operation to improve performance.

Figure 4:
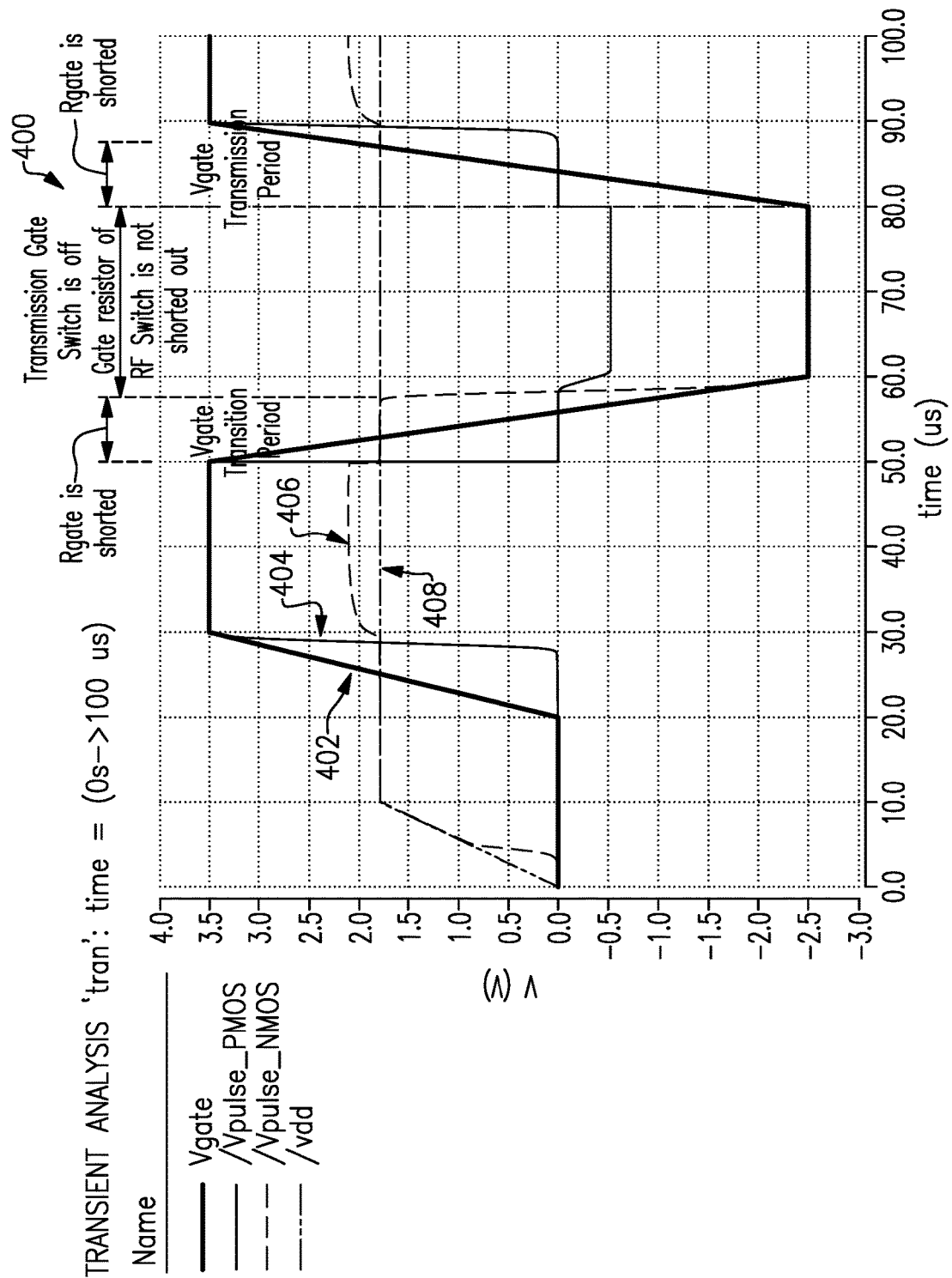
FIG. 4 provides a graph illustrating voltage values associated with various components of the circuit of FIG. 3.

FIG. 4 provides a graph 400 illustrating voltage values associated with various components of the circuit 300 of FIG. 3. A first plot 402 represents a gate voltage, a second plot 404 represents a first pulse voltage (e.g., into the PMOS 318 of the circuit 300 of FIG. 3), a third plot 406 represents a second pulse voltage (e.g., into the NMOS 324 of the circuit 300 of FIG. 3), and/or a fourth plot 408 represents a voltage source (Vlogic). For example, a voltage source (e.g., the first voltage source 302 of FIG. 3) may begin increasing in voltage at a 0s point of the graph 400 and/or may increase gradually until it reaches a determined voltage value (e.g., 1.8V, "Vlogic") at approximately a 10 us mark. A gate voltage of the RF switch 310 may remain at approximately 0V for a period of time (e.g., approximately 20 us) after the voltage source turns on and/or may increase to a maximum value (e.g., approximately 3.5V, "V2") for period of time (e.g., approximately 20 us) and/or may decrease to a minimum value (e.g., −2.5V, "−V1") for a period of time (e.g., approximately 20 us) and/or may oscillate periodically between the maximum value and the minimum value.

The gate voltage may transition from the maximum voltage to the minimum voltage at a gate voltage transition period. During the transition period, the gate resistor may be shorted. The gate voltage may increase from the minimum voltage to the maximum voltage at a gate voltage transmission period. During the transmission period, the gate resistor may be shorted. While the gate voltage maintains the minimum value, a transmission gate switch may be off, the gate resistor of the RF switch may not be shorted out.

The first pulse voltage may have a delayed ramp-up and/or may increase from 0V to the maximum value at approximately the 30 us mark and/or may decrease back to 0V at approximately the 50 us mark. The first pulse voltage may dip down to a negative value (e.g., approximately −0.5V) but may periodically increase back to the maximum value. Thus, the voltage swing of the first pulse voltage may be approximately 4V. The second pulse voltage may increase to the Vlogic value (e.g., approximately 1.8V) simultaneously or near-simultaneously with the voltage source and/or may increase slightly above Vlogic (e.g., to approximately 2.1V) and/or may periodically oscillate between Vlogic and the minimum value (e.g., approximately −2.5V). Thus, the voltage swing of the second pulse voltage may be approximately 4.6V. The voltage swings of Vgs of the PMOS 318 (e.g., a difference between the first plot 402 and the second plot 404 may be less than V2 (e.g., 3.5V). The voltage swing of Vgs of NMOS 324 (e.g., a difference between the third plot 406 and the first plot 402) may each be less than a sum of Vlogic and V1 (e.g., 4.3V) and/or may be less than a breakdown voltage of the transmission gate switches PMOS 318 and NMOS 324.

Figure 5:
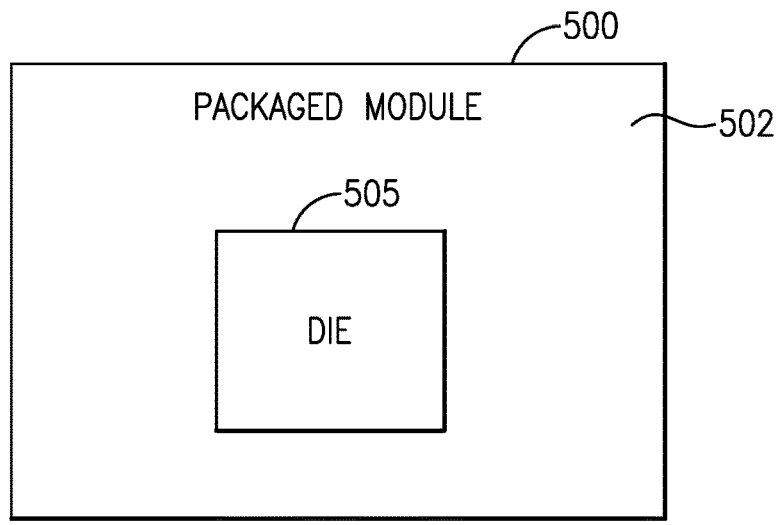
FIG. 5 shows a die implemented in a packaged module.

FIG. 5 shows a die 505 implemented in a packaged module 500. Such a packaged module can include a packaging substrate 502 configured to receive a plurality of components.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart phone, a hand-held wireless device with or without phone functionality, a wireless tablet, etc.

Figure 6:
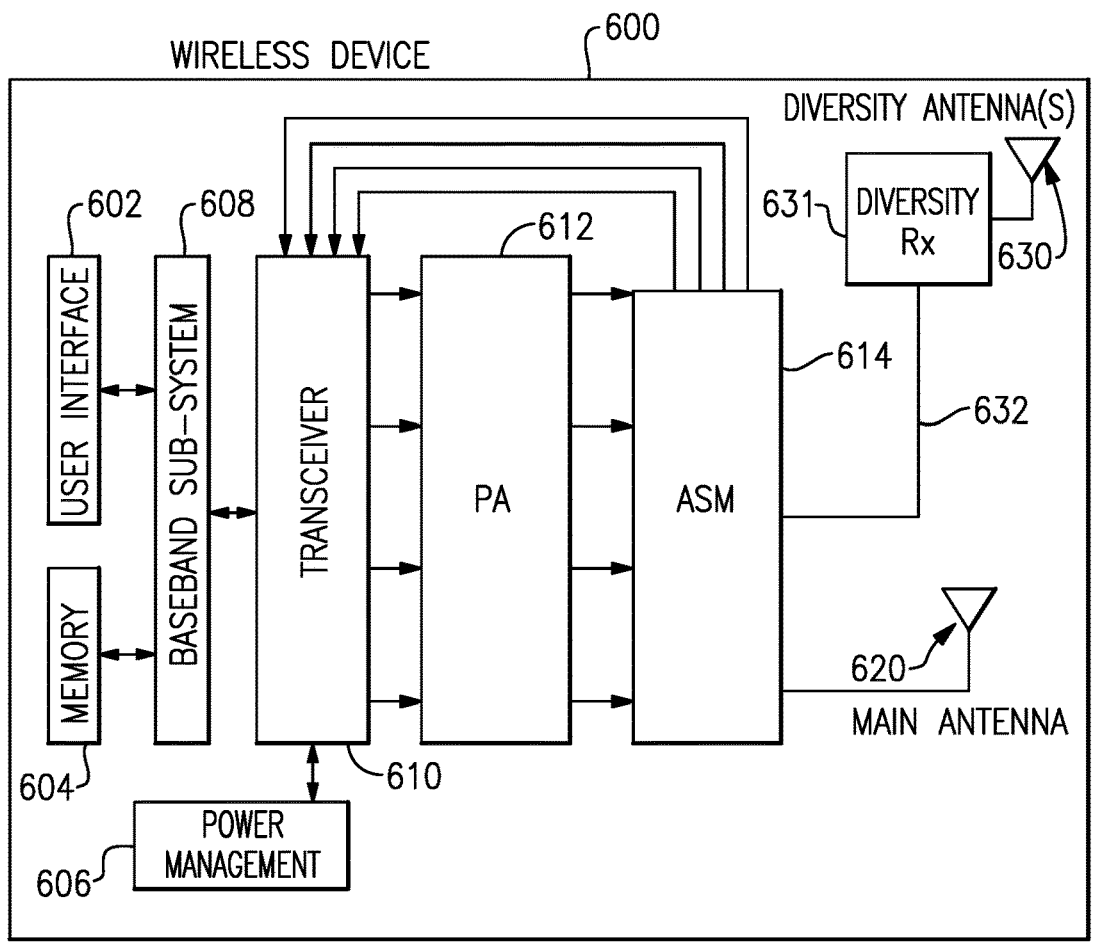
FIG. 6 depicts an example wireless device having one or more advantageous features described herein.

FIG. 6 depicts an example wireless device 600 having one or more advantageous features described herein. In some embodiments, a module that includes one or more power amplifiers can also include one or more clamps having one or more features as described herein.

In the example of FIG. 6, power amplifiers (PAs) are depicted in a PA module 612; however, it will be understood that such power amplifiers can be implemented in one or more functional blocks, one or more devices such as die or modules, etc. Such power amplifiers can receive their respective RF signals from a transceiver 610 that can be configured and operated to generate RF signals to be amplified and transmitted, and to process received signals. The transceiver 610 is shown to interact with a baseband sub-system 608 that is configured to provide conversion between data and/or voice signals suitable for a user and RF signals suitable for the transceiver 610. The transceiver 610 is also shown to be connected to a power management component 606 that is configured to manage power for the operation of the wireless device 600. Such power management can also control operations of the baseband sub-system 608 and other components of the wireless device 600.

The baseband sub-system 608 is shown to be connected to a user interface 602 to facilitate various input and output of voice and/or data provided to and received from the user. The baseband sub-system 608 can also be connected to a memory 604 that is configured to store data and/or instructions to facilitate the operation of the wireless device, and/or to provide storage of information for the user.

In the example of FIG. 6, a diversity receive (DRx) module 631 can be implemented between one or more diversity antennas (e.g., diversity antenna 630) and the front-end module. Such a configuration can allow an RF signal received through the diversity antenna 630 to be processed (in some embodiments, including amplification by an LNA) with little or no loss of and/or little or no addition of noise to the RF signal from the diversity antenna 630. Such processed signal from the DRx module 640 can then be routed to the front-end module through one or more signal paths. In some embodiments, the wireless device 600 may or may not include the foregoing DRx functionality.

In the example of FIG. 6, a plurality of antennas (e.g., 620a, 620b) can be configured to, for example, facilitate transmission of RF signals from the PA module 612. In some embodiments, receive operations can also be achieved through some or all of the antennas 620a, 620b.

Some implementations of the present disclosure relate to a switching circuit including: an RF switch; a gate resistor; a voltage source; a transmission gate; and coupling circuitry configured to couple a gate of the RF switch, a first side of the gate resistor, and the transmission gate at a first node and the voltage source, a second side of the gate resistor, and the transmission gate at a second node.

In some aspects, the techniques described herein relate to a switching circuit wherein the transmission gate includes a PMOS.

In some aspects, the techniques described herein relate to a switching circuit wherein the transmission gate includes an NMOS.

In some aspects, the techniques described herein relate to a switching circuit wherein the coupling circuitry is further configured to couple a source of the PMOS to a drain of the NMOS.

In some aspects, the techniques described herein relate to a switching circuit wherein the coupling circuitry is further configured to couple a drain of the PMOS to a source of the NMOS.

In some aspects, the techniques described herein relate to a switching circuit wherein the coupling circuitry is further configured to couple the gate of the RF switch, the first side of the gate resistor, a drain of the PMOS, and a source of the NMOS at the first node.

In some aspects, the techniques described herein relate to a switching circuit wherein the coupling circuitry is further configured to couple the voltage source, the second side of the gate resistor, a source of the PMOS, and a drain of the NMOS at the second node.

In some aspects, the techniques described herein relate to a switching circuit further including a first level shifter configured to supply voltage pulses to the PMOS.

In some aspects, the techniques described herein relate to a switching circuit further including a second level shifter configured to supply voltage pulses to the NMOS.

In some aspects, the techniques described herein relate to a switching circuit wherein the first level shifter and the second level shifter are configured to apply complementary dynamic pulses to the PMOS and NMOS.

In some aspects, the techniques described herein relate to a switching circuit wherein the first level shifter and the second level shifter are configured to turn on when the RF switch is turned on.

In some aspects, the techniques described herein relate to a switching circuit further including a first voltage pulse source coupled to the first level shifter.

In some aspects, the techniques described herein relate to a switching circuit further including a second voltage pulse source coupled to the second level shifter.

In some aspects, the techniques described herein relate to a switching circuit wherein the coupling circuitry is further configured to couple the gate resistor in parallel with the transmission gate.

In some aspects, the techniques described herein relate to a switching circuit wherein the transmission gate is configured to short out the gate resistor.

In some aspects, the techniques described herein relate to a circuit including: an RF switch; a transmission gate including a PMOS and an NMOS, wherein the transmission gate is configured to provide dynamic complementary pulsing voltages to the RF switch; and coupling circuitry configured to couple a gate of the RF switch to the transmission gate.

In some aspects, the techniques described herein relate to a circuit further including a gate resistor, wherein the coupling circuitry is further configured to couple the gate of the RF switch, the gate resistor, and the transmission gate at a first node.

In some aspects, the techniques described herein relate to a circuit wherein the transmission gate is configured to short out the gate resistor in response to the RF switch turning on.

In some aspects, the techniques described herein relate to a circuit further including a first level shifter coupled to a gate of the PMOS.

In some aspects, the techniques described herein relate to a circuit further including a second level shifter coupled to a gate of the NMOS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general-purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general-purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips and/or magnetic disks, into a different state.

What is claimed is:

1. A switching circuit comprising:
   a radio frequency (RF) switch including a gate;
   a gate resistor coupled at a first side of the gate resistor to the gate the RF switch at a first node;
   a voltage source coupled to a second side of the gate resistor at a second node;
   a transmission gate including a first semiconductor and a second semiconductor, the transmission gate being coupled to the first side of the gate resistor and the gate of the RF switch at the first node and further being coupled to the voltage source and the second side of the gate resistor at the second node;

a first level shifter coupled to the first semiconductor and configured to supply voltage pulses to the first semiconductor; and a second level shifter coupled to the second semiconductor and configured to supply voltage pulses to the second semiconductor.

2. The switching circuit of claim 1 wherein the first semiconductor comprises a p-channel metal-oxide-semiconductor (PMOS).

3. The switching circuit of claim 2 wherein the second semiconductor comprises an n-channel metal-oxide-semiconductor (NMOS).

4. The switching circuit of claim 3 wherein a source of the PMOS is coupled to a drain of the NMOS.

5. The switching circuit of claim 3 wherein a drain of the PMOS is coupled to a source of the NMOS.

6. The switching circuit of claim 3 wherein the gate of the RF switch, the first side of the gate resistor, a drain of the PMOS, and a source of the NMOS are coupled at the first node.

7. The switching circuit of claim 3 wherein the voltage source, the second side of the gate resistor, a source of the PMOS, and a drain of the NMOS are coupled at the second node.

8. The switching circuit of claim 1 wherein the first level shifter and the second level shifter are configured to apply complementary dynamic pulses to the first semiconductor and the second semiconductor.

9. The switching circuit of claim 8 wherein the transmission gate is configured to short out the gate resistor.

10. The switching circuit of claim 1 wherein the first level shifter and the second level shifter are configured to turn on when the RF switch is turned on.

11. The switching circuit of claim 1 further comprising a first voltage pulse source coupled to the first level shifter.

12. The switching circuit of claim 11 further comprising a second voltage pulse source coupled to the second level shifter.

13. The switching circuit of claim 1 wherein the gate resistor is coupled in parallel with the transmission gate.

14. A circuit comprising:
a radio frequency (RF) switch including a gate;
a transmission gate including a p-channel metal-oxide-semiconductor (PMOS) and an n-channel metal-oxide-semiconductor (NMOS), the transmission gate being coupled to the gate of the RF switch and being configured to provide dynamic complementary pulsing voltages to the RF switch;
a first level shifter coupled to the PMOS and configured to supply voltage pulses to the PMOS; and
a second level shifter coupled to the NMOS and configured to supply voltage pulses to the NMOS.

15. The circuit of claim 14 further comprising a gate resistor, wherein the gate of the RF switch, the gate resistor, and the transmission gate are coupled at a first node.

16. The circuit of claim 15 wherein the transmission gate is configured to short out the gate resistor in response to the RF switch turning on.

* * * * *